United States Patent
Wydotis

(10) Patent No.: US 10,589,766 B2
(45) Date of Patent: Mar. 17, 2020

(54) RAILROAD CROSSING GATE MONITORING AND ALARM SYSTEM

(71) Applicant: Siemens Industry, Inc., Alpharetta, GA (US)

(72) Inventor: Leonard Wydotis, Marion, KY (US)

(73) Assignee: SIEMENS MOBILITY, INC., New York, NY (US)

( * ) Notice: Subject to any disclaimer, the term of this patent is extended or adjusted under 35 U.S.C. 154(b) by 307 days.

(21) Appl. No.: 15/610,826

(22) Filed: Jun. 1, 2017

(65) Prior Publication Data

US 2018/0346003 A1    Dec. 6, 2018

(51) Int. Cl.
| | |
|---|---|
| *B61L 29/30* | (2006.01) |
| *G01R 31/34* | (2020.01) |
| *B61L 29/28* | (2006.01) |
| *B61L 29/24* | (2006.01) |

(52) U.S. Cl.
CPC ............. *B61L 29/30* (2013.01); *B61L 29/243* (2013.01); *B61L 29/288* (2013.01); *G01R 31/343* (2013.01)

(58) Field of Classification Search
CPC .......... B61L 5/12; B61L 23/007; B61L 29/30; B61L 29/243; B61L 29/288
See application file for complete search history.

(56) References Cited

U.S. PATENT DOCUMENTS

| | | | | |
|---|---|---|---|---|
| 4,203,058 A * | 5/1980 | Chen | ..................... | H02H 7/0811 318/380 |
| 4,703,303 A * | 10/1987 | Snee | ..................... | B61L 29/288 246/125 |
| 5,734,245 A * | 3/1998 | Terashima | ......... | G05B 19/4061 318/453 |
| 5,952,801 A * | 9/1999 | Boisvert | .............. | H02H 7/0851 318/468 |
| 6,276,744 B1 * | 8/2001 | Huber | ........................ | B60J 5/14 160/181 |
| 7,123,165 B2 * | 10/2006 | Davenport | ............ | B61L 5/1881 340/931 |
| 7,154,403 B2 * | 12/2006 | Davenport | ............ | B61L 5/1881 340/641 |
| 7,195,211 B2 * | 3/2007 | Kande | ..................... | B61L 29/16 246/125 |
| 7,395,139 B2 * | 7/2008 | Burton | .................... | B61L 23/00 104/7.2 |
| 7,789,348 B2 * | 9/2010 | Ruggiero | ................ | B61L 29/30 246/111 |
| 8,515,697 B2 * | 8/2013 | Alexander | ............ | B61L 5/1881 246/122 R |
| 8,581,499 B2 * | 11/2013 | Fries | ....................... | B61L 5/189 315/129 |
| 9,205,852 B2 * | 12/2015 | Honeck | .................... | B61L 29/08 |
| 9,809,237 B2 * | 11/2017 | DeJarnatt | ............ | B61L 15/0027 |
| 2004/0182970 A1 * | 9/2004 | Mollet | .................... | B61L 29/30 246/473 R |
| 2004/0201486 A1 * | 10/2004 | Knowles | ............... | B61L 5/1881 340/657 |

(Continued)

Primary Examiner — Zachary L Kuhfuss

(57) ABSTRACT

Aspects of the disclosed embodiments generally relate to a current monitoring and alarm system for a railroad crossing gate. The system is capable of determining that the gate is functioning properly or not. In addition, the system can issue an alarm or provide some other indicator when the gate is not functioning properly or is being subjected to excessive loading.

12 Claims, 2 Drawing Sheets

(56) References Cited

U.S. PATENT DOCUMENTS

| | | | |
|---|---|---|---|
| 2005/0284987 A1* | 12/2005 | Kande | B61L 29/16 246/125 |
| 2006/0001547 A1 | 1/2006 | Davenport et al. | |
| 2006/0259202 A1* | 11/2006 | Vaish | B61L 5/1881 700/295 |
| 2007/0130834 A1* | 6/2007 | Kande | B61L 29/16 49/139 |
| 2013/0256466 A1* | 10/2013 | Carlson | B61L 5/00 246/218 |
| 2015/0028163 A1* | 1/2015 | Hochman | B61L 5/1881 246/194 |
| 2017/0166226 A1* | 6/2017 | Von Flottwell | B61K 9/08 |
| 2018/0346003 A1* | 12/2018 | Wydotis | G01R 31/343 |

\* cited by examiner

RAILROAD CROSSING GATE MONITORING AND ALARM SYSTEM

BACKGROUND

1. Field

Embodiments of the invention relate to railroad crossing gates and, more particularly, to a monitoring and alarm system for a railroad crossing gate.

2. Description of the Related Art

At many roadway railroad crossings, pedestrian paths and sidewalks also cross the railroad track. Crossing gates, which typically are raised by default and lowered when a train approaches and crosses an intersection of a road and railroad track (i.e., a crossing), may be provided for roadway and pedestrian safety. In some instances, there may be separate gates for the roadway and the pedestrian path. For public safety reasons, it is essential that these crossing gates operate correctly.

Typically, railroad crossing gates utilize electrical and mechanical components to ensure that the gates perform their intended functions correctly. For example, gate arms are lowered using a motor located in a gate control mechanism. The same mechanism uses or is connected to counterweights to counterbalance the gate arms during movement of the arms. It is necessary to properly adjust the gate arm counterweights to achieve the proper horizontal and vertical torques as recommended by the motor's manufacturer. It is known that there is a direct correlation between improper torque adjustments and excessive motor current draw. If the counterweights are not adjusted correctly by the installer or maintainer of the crossing gate, and either the vertical or horizontal torques are not set properly, the gate motor will draw excessive current, which could lead to a motor and gate malfunction. As can be appreciated, this is undesirable.

Moreover, external factors can cause undesirable and excessive loading on the gate arms (and thus the motor). For example, ice, snow or some other type of build-up can add extra weight to the gate arms until the build-up is removed. Extra loading on the gate arms can also occur through mischief such as e.g., individuals hanging off the end of the gate arms. In addition to being dangerous to the individual, the extra weight will be harmful to the gate control mechanism's motor. As noted above, there is a direct correlation to the amount of work the gate control mechanism has to perform and the amount of current the electric motor in the mechanism draws. All of the above situations will cause the motor to draw more current, which can lead to a motor malfunction.

Currently, there are no options for railroad companies to monitor the electrical performance of their crossing gates. Without the ability to monitor the real-time electrical performance of its crossing gates, railroad companies will not become aware that a gate is operating improperly until there has been some type of catastrophic malfunction that is observed and reported by the motoring public (i.e., citizens) or by train crews that observe and report that the gate is not operating as intended.

Accordingly, there is a need and desire for a device that can monitor a railroad crossing gate and determine that the gate is functioning properly or not. In addition, there is a need and desire for a device that can monitor a railroad crossing gate and issue an alarm or other indication when the gate is not functioning properly or is being subjected to excessive loading.

SUMMARY

Embodiments disclosed herein provide a system that monitors a railroad crossing gate and determines that the gate is functioning properly or not. In addition, the system can issue an alarm or provide some other indicator when the gate is not functioning properly or is being subjected to excessive loading.

In one embodiment, a system for monitoring a railroad device is provided. The system comprises a sensing device for monitoring an electrical characteristic of the railroad device, said sensing device generating a first output when the electrical characteristic exceeds a predetermined threshold and a first monitoring device connected to the first output of the sensing device, said first monitoring device providing at least one of an audible or a visual indication when the electrical characteristic exceeds the predetermined threshold.

In another embodiment, a method of monitoring a railroad device. The method comprises monitoring an electrical characteristic of the railroad device; generating a first output when the electrical characteristic exceeds a predetermined threshold; and providing at least one of an audible or a visual indication when the electrical characteristic exceeds the predetermined threshold.

In some implementations, the railroad device is a motor for a crossing gate, the electrical characteristic is a current draw of the motor and the sensing device is a current sensing switch. In some implementations, the sensing device monitors the electrical characteristic of the railroad device in an electrically isolated manner.

In some implementations, the sensing device generates a second output when the electrical characteristic exceeds the predetermined threshold and said system further comprises a second monitoring device connected to the second output of the sensing device. In some implementations, the first monitoring device is located at or within a gate control mechanism for the crossing gate and the second monitoring device is remotely located from the crossing gate.

Further areas of applicability of the present disclosure will become apparent from the detailed description, drawings and claims provided hereinafter. It should be understood that the detailed description, including disclosed embodiments and drawings, are merely exemplary in nature intended for purposes of illustration only and are not intended to limit the scope of the invention, its application or use. Thus, variations that do not depart from the gist of the invention are intended to be within the scope of the invention.

DETAILED DESCRIPTION

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
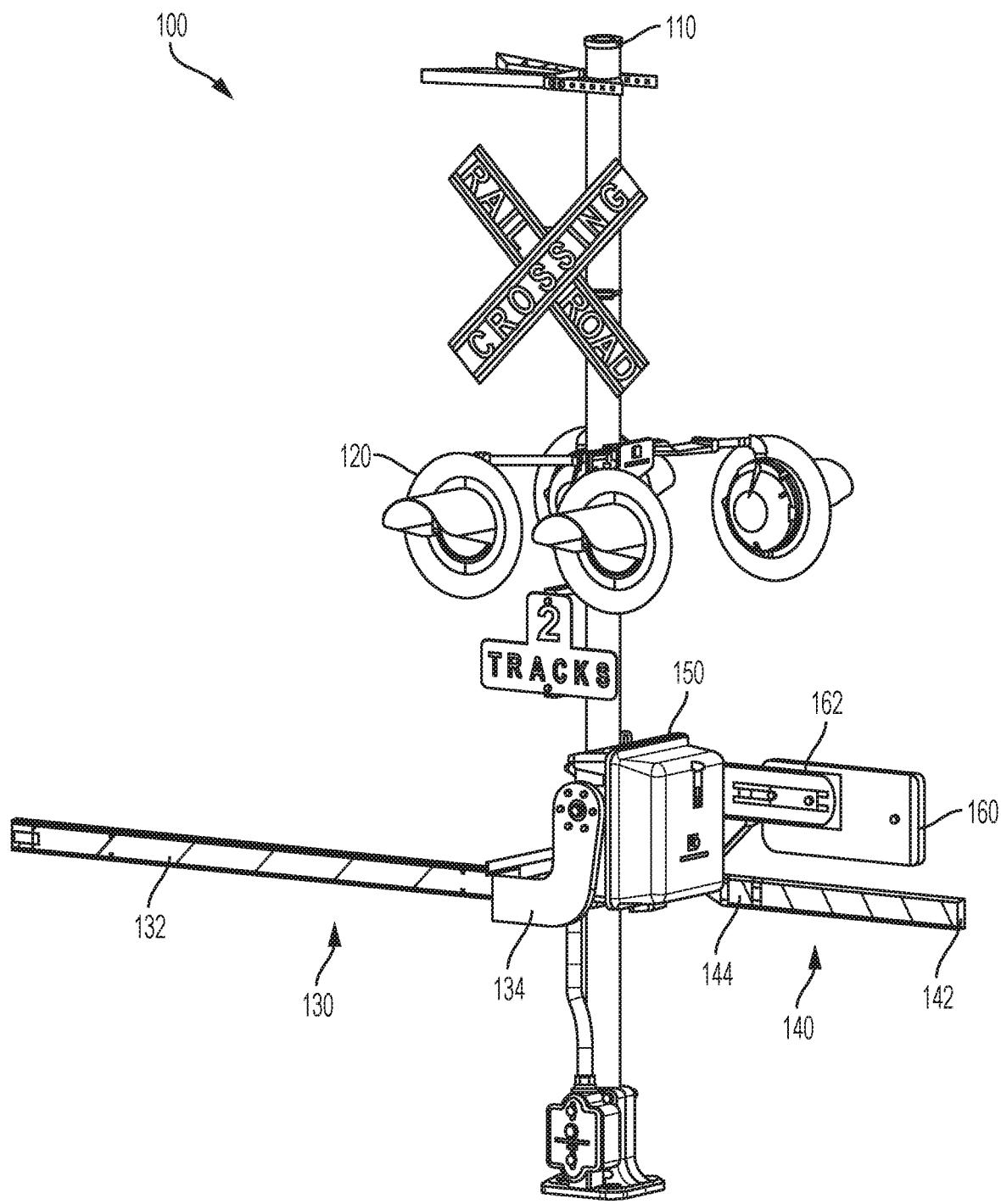
FIG. 1 illustrates an example railroad crossing gate according to an embodiment of the invention.

FIG. 1 illustrates a railroad crossing gate 100 in a lowered or horizontal position. At many railroad crossings, at least one railroad crossing gate 100 may be placed on either side of the railroad track to restrict roadway traffic in both directions. At some crossings, pedestrian paths or sidewalks may run parallel to the roadway. To restrict road and sidewalk traffic, the illustrated railroad crossing gate 100 includes a separate roadway gate 130 and pedestrian gate 140. The roadway gate 130 and pedestrian gate 140 may be raised and lowered by the same gate control mechanism 150.

The example railroad crossing gate 100 also includes a pole 110 and signal lights 120. The gate control mechanism 150 is attached to the pole 110 and is used to raise and lower the roadway and pedestrian gates 130, 140. The illustrated railroad crossing gate 100 is often referred to as a combined crossing gate. When a train approaches the crossing, the railroad crossing gate 100 may provide a visual warning using the signal lights 120. The gate control mechanism 150 will lower the roadway gate 130 and the pedestrian gate 140 to respectively restrict traffic and pedestrians from crossing the track until the train has passed.

As shown in FIG. 1, the roadway gate 130 comprises a roadway gate support arm 134 that attaches a roadway gate arm 132 to the gate control mechanism 150. Similarly, the pedestrian gate 140 comprises a pedestrian gate support arm 144 connecting a pedestrian gate arm 142 to the gate control mechanism 150. When raised, the gates 130 and 140 are positioned so that they do not interfere with either roadway or pedestrian traffic. This position is often referred to as the vertical position. A counterweight 160 is connected to a counterweight arm 162 connected to the gate control mechanism 150 to counterbalance the roadway gate arm 132. Although not shown, another counterweight could be provided to counterbalance the pedestrian gate arm 142.

Typically, the gates 130, 140 are lowered from the vertical position using a motor contained within the gate control mechanism 150. The motor drives gearing (not shown) connected to shafts (not shown) connected to the roadway gate support arm 134 and pedestrian gate support arm 144. The support arms 134, 144 are usually driven part of the way down by the motor (e.g., somewhere between 70 and 45 degrees) and then gravity and momentum are allowed to bring the arms 132, 142 and the support arms 134, 144 to the horizontal position. It should be appreciated that the arms 132, 142 when lowered will not always be exactly parallel with the ground when in the "horizontal position." As such, the final "horizontal position" of the arms 132, 142 may include deviations from a true parallel relationship with the ground. It should be appreciated that the arms 132, 142 when raised will not always be exactly perpendicular to the ground when in the "vertical position." As such, the final raised "vertical position" of the arms 132, 142 may include deviations from a true perpendicular relationship with the ground.

Figure 2:
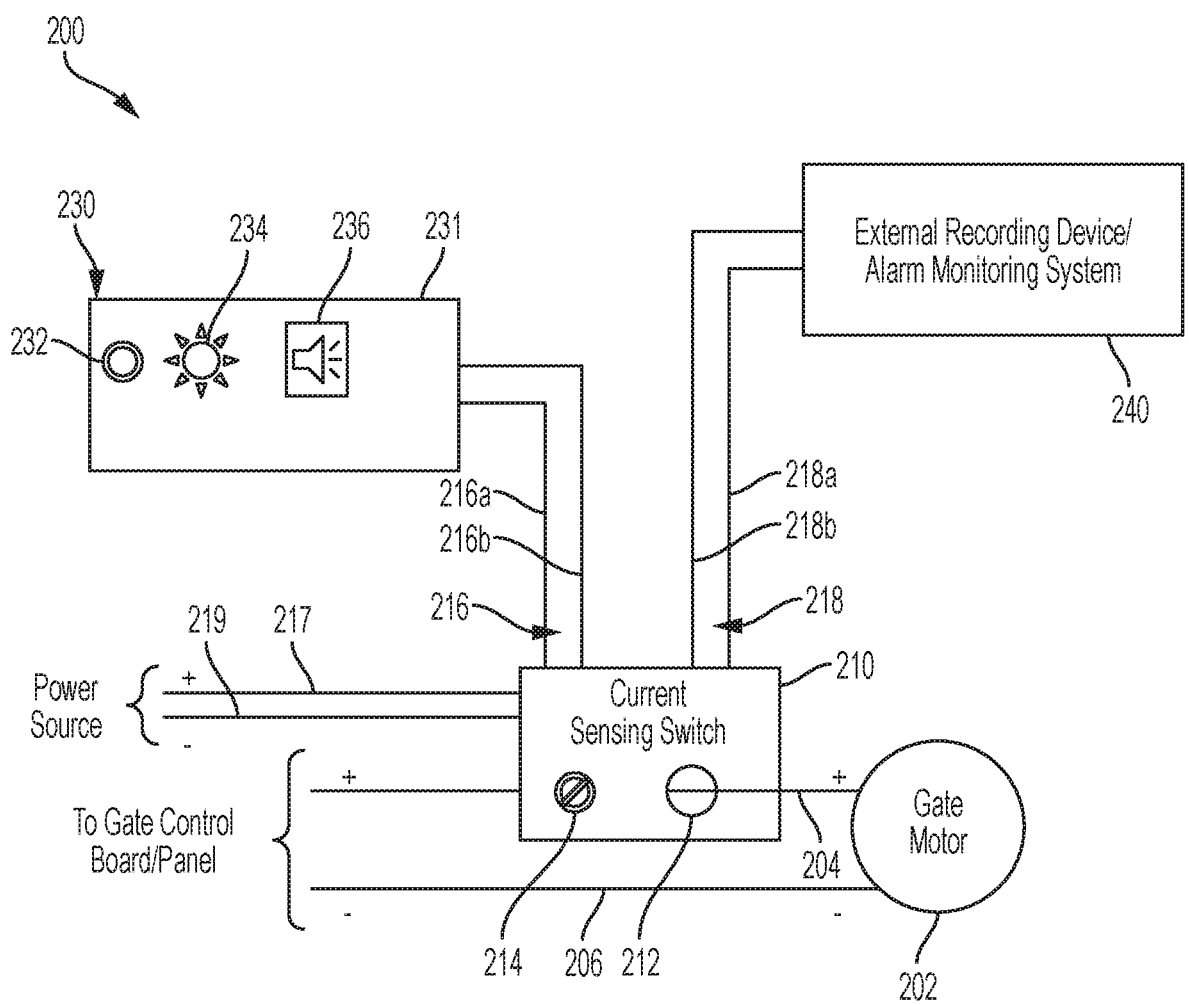
FIG. 2 illustrates an example railroad crossing gate monitoring and alarm system according to an embodiment of the invention.

In accordance with the disclosed principles, the gate control mechanism 150 may house or be connected to a monitoring and alarm system such as the current monitoring and alarm system 200 illustrated in FIG. 2. If the system 200 is not housed within the gate control mechanism 150, it may be located in a wayside equipment shelter typically found in the proximity of the crossing gate 100. It should be appreciated that the exact location of the system 200 is not limiting on the principles disclosed herein.

Referring now to FIG. 2, the monitoring and alarm system 200 includes a current sensing device such as a current sensing switch 210 and a local current monitor 230. In some implementations, a remote device 240 that can be e.g., a recording device or an alarm system (discussed below in more detail) may also be included in the system 200. As will be described below, the system 200, and the switch 210 in particular, will be able to sense and monitor the current drawn by a gate motor 202 (of gate control mechanism 150) in a manner that is completely isolated from the control wiring of the crossing gate 100 and its motor 202.

The system 200 can be adapted for AC or DC motors 202 by choosing the appropriate type of current sensing switch 210. That is, if the gate motor 202 is a DC motor, the current sensing switch 210 will be a DC current sensing switch and if the gate motor 202 is an AC motor, the current sensing switch 210 will be an AC current sensing switch. An example of a suitable current sensing switch 210 for either DC or AC applications includes, but is not limited to, a DS3 Series current sensing switch from NK Technologies. It should be appreciated, however, that as long as the disclosed principles are incorporated into the switch 210, any suitable current sensing switch can be used for switch 210, including modified versions of existing switches or a custom designed and manufactured switch.

The current sensing switch 210 will be powered by a power source used to provide power to components within the gate control mechanism 150 or components within the wayside equipment shelter. In the illustrated embodiment, the current sensing switch 210 is connected to the power source by a first lead 217 and a second lead 219. In the illustrated example, the first lead 217 is a positive lead while the second lead 219 is a negative lead.

In the illustrated embodiment, the current sensing switch 210 has a hole 212 or some type of opening passing through the core of the switch 210. In the illustrated embodiment, a first lead 204 connected between the gate motor 202 and a gate control board/panel is passed through the hole 212 in the switch 210. In the illustrated example, the first lead 204 is a positive lead while a second lead 206 connected between the gate motor 202 and the gate control board/panel is a negative lead. As is known in the art, the current sensing switch 210 can sense the current on the first lead 204 based on its proximity to the lead 204 by sensing e.g., a magnetic field produced when current passes through the core of the switch 210. As such, the switch 210 can sense the motor's current draw in an isolated manner and without tapping into the connection between the motor 202 and gate control board/panel. This is highly desirable since the switch 210 will not disrupt, interfere with or otherwise corrupt the connection between the gate motor 202 and gate control board/panel.

In the illustrated embodiment, the current sensing switch 210 has a first or local output 216 and a second or remote output 218. The first output 216 is connected to the local current monitor 230 by e.g., first and second leads 216a, 216b. The second output 218 is connected to the remote device 240 by e.g., first and second leads 218a, 218b. It should be appreciated that more or less leads 216a, 216b could be used to connect the first switch output 216 to the local current monitor 230 as long as the connections between the first switch output 216 and the local current monitor 230 are compatible and are operational. Likewise, more or less leads 218a, 218b could be used to connect the second switch output 218 to the remote device 240 as long as the connections between the second switch output 218 and the remote device 240 are compatible and are operational.

In one embodiment, the first output 216 is a relay output (e.g., an analog output) while the second output 218 is a solid state output (e.g., a digital output). The outputs 216, 218 are energized when the gate motor current exceeds a preset threshold on the current sensing switch 210. In a desired embodiment, the switch 210 is calibrated, using a current threshold adjustment 214, to a maximum current threshold, which is typically 15 amperes DC or 3 amperes AC for railroad crossing gate applications. The switch 210 will continually monitor the motor's 202 current and when the current exceeds the maximum current threshold, the switch 210 will energize both outputs 216, 218, indicating that the crossing gate 100 is experiencing excessive loads during operation. In one embodiment, the maximum current threshold adheres to the recommended maximum current level as defined by the gate motor 202 manufacturer. It should be appreciated, however, that the disclosed embodiments should not be limited to any particular maximum current threshold value. All that is required is that the switch 210 be calibrated such that stressful and/or improper operation of the gate motor 202 can be determined via the current monitoring described herein.

The local current monitor 230 may comprise a visual indicator 234 and/or an audible indicator 236. The components within the local current monitor 230 can be housed within its own enclosure 231 or as part of the housing for gate control mechanism 150 or the wayside equipment shelter.

The visual indicator 234 may include one or more light-emitting diodes (LEDs) or other similar visual indicator. The visual indicator 234 may output one color (e.g., green) when the input to the local current monitor 230 (i.e., switch output 216) indicates that there is no error or alarm condition and may output a second, different color (e.g., red) when the input to the local current monitor 230 (i.e., switch output 216) indicates that there is an error or alarm condition. Alternatively, the visual indicator 234 may only output one color (e.g., red) when the input to the local current monitor 230 (i.e., switch output 216) indicates that there is an error or alarm condition. A flashing LED, LEDs or lights could also be used as part of the visual indicator 234 when an error or alarm condition is detected.

The audible indicator 236 may include a buzzer, whistle or other sound emitting device (e.g., bells, tone generator). The audible indicator 236 can output its audible indication (buzz, whistle, ringing bell, tone, etc.) when the input to the local current monitor 230 (i.e., switch output 216) indicates that there is an error or alarm condition. As can be appreciated, the use of either or both of the visual indicator 234 and/or audible indicator 236 provides on-site maintenance personnel with a warning that the gate motor current has exceeded the maximum current threshold and, therefore, that something needs to be inspected at the crossing gate 100.

In operation, an energized output 216 (indicating an error or alarm condition) will trigger the circuitry within the local current monitor 230 such that visual indicator 234 and/or an audible indicator 236 will become active. The local current monitor 230 can be configured to keep the visual indicator 234 and/or audible indicator 236 in the active state until maintenance or other personnel manually deactivate the visual indicator 234 and/or audible indicator 236. For example, the local current monitor 230 may include an alarm reset button 232 that can be used to clear the error/alarm condition at the local monitor 230 such that the active visual indicator 234 and/or audible indicator 236 become deactivated (i.e., in a condition where the visual indicator 234 does not provide a visual indication of an error/alarm and the audible indicator 236 does not provide the audible indication of an error/alarm). Alternatively, the local current monitor 230 can be configured to deactivate the visual indicator 234 and/or audible indicator 236 as soon as it receives a de-energized input signal (i.e., switch output 216) that indicates that there is no error or alarm condition. In this alternative, the alarm reset button 232 would not be required.

In the illustrated embodiment, the switch 210 is also connected to the remote device 240. The second or solid state output 218 can be fed to the remote device 240, which can be a remote event recorder or other type of monitoring device/system that can record and transmit an error/alarm condition to e.g., a railroad's headquarters, maintenance crew, etc. Examples of devices suitable for the remote device include the Wayguard® Event Recorders, Argus Series; Wayguard® Event Analyzer/Recorders, SEAR II Series by Siemens Industry Inc. These type of event recorders and/or analyzer/recorders typically include multiple (e.g., 12 or more) digital inputs that could be connected to the switch's solid state output 218. They also provide multiple (e.g., eight or more) alarm indication LEDs or other indicators. They also typically include flash memory for storing months-worth of events (e.g., more than 200,000 events). Reports can be stored and software loaded using a USB memory stick and built-in USB ports. These type of event recorders and/or analyzer/recorders typically include an Ethernet or other port that allows communications to other devices over wireless IP networks and a LAN interface for local, wire communications to other devices as is known in the art.

Using a remote device 240 allows the railroad company to remotely detect that there is an undesired condition at the crossing gate 100, allowing the railroad company to dispatch maintenance or other personnel to the gate location before a catastrophic failure occurs. These types of event recorders and monitoring systems are typically already installed in most active highway crossing systems throughout the United States. All that is required is to connect the remote device 240 to the solid state output 218 of the switch 210 and monitoring can be performed in accordance with the disclosed principles.

As can be appreciated, the system 200 disclosed herein provides many advantages and benefits that are not obtainable by current railroad crossing gate systems. For example, the local output can be used to activate a visual and/or an audible indicator that can be used to alert on-site maintenance or other personnel of an abnormal condition (e.g., an over-current condition). At the same time, the remote output can be used as an input to a remote monitoring system or event recording device. These devices can be used to alert the railroad control centers that a problem is imminent and maintenance personnel should be dispatched to the location. Moreover, all of the indications can be used to detect overloading of the gate motor, whether by improper set up of the crossing gate's mechanical parts, build-up on the gate arms, and/or mischief such as e.g., individuals hanging off the end of the gate arms. Similarly, all of the system's 200 indications can be used to detect overloading of the gate motor, whether it be a constant condition (e.g., by improper set up of the crossing gate's mechanical parts or build-up on the gate arms) or an intermittent one (e.g., by individuals hanging off the end of the gate arms for a short period of time).

As noted above, the disclosed system 200 is completely isolated from the control wiring of the crossing gate and gate motor, meaning that there is no danger to the wiring and connections of the standard crossing gate equipment. In addition, because this system 200 is completely isolated from the gate control wiring, any concerns with this system's 200 ability to interfere with the proper, fail-safe operation of the crossing gate are eliminated. Moreover, the system's 200 monitoring is performed on a closed-loop motor power circuit and can therefore be stored in a number of different locations without affecting the measuring and detecting accuracy of the system 200.

By providing local maintenance personnel with the local current monitor 230, they will now have the ability to receive confirmation that the crossing gate is operating as intended and is not misadjusted after they have installed and adjusted it. Thus, providing the railroad company that its crossing gates have been deployed properly and operating correctly. One other additional benefit of the system 200 disclosed herein is that it can be used with and retro-fitted to existing crossing gate equipment regardless of the railroad company or manufacturer of the equipment.

It should be appreciated that the disclosed system 200 could be used to monitor other equipment whose performance can be monitored via current sensing including railway Switch Machines used to move rail switch points and Electric Train Stops used to stop a rail vehicle in the event the driver of the train fails to stop for a red signal. As noted above, all that is required is to put a lead from the equipment in close proximity to a calibrated switch 210 and the local current monitor 230 can be used to indicate when improper operation of the equipment is occurring.

The foregoing examples are provided merely for the purpose of explanation and are in no way to be construed as limiting. Further areas of applicability of the present disclosure will become apparent from the detailed description, drawings and claims provided hereinafter. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

Additionally, the purpose of the Abstract is to enable the patent office and the public generally, and especially the scientists, engineers and practitioners in the art who are not familiar with patent or legal terms or phraseology, to determine quickly from a cursory inspection the nature of the technical disclosure of the application. The Abstract is not intended to be limiting as to the scope of the present inventions in any way.

I claim:

1. A system for monitoring a railroad device, said system comprising:
   a sensing device for monitoring an electrical characteristic of the railroad device, said sensing device generating a first output when the electrical characteristic exceeds a predetermined threshold; and
   a first monitoring device connected to the first output of the sensing device, said first monitoring device providing at least one of an audible or a visual indication when the electrical characteristic exceeds the predetermined threshold,
   wherein the railroad device is a motor for the crossing gate, the electrical characteristic is a current draw of the motor and the sensing device is a current sensing switch, said current sensing switch comprising an adjustment mechanism for setting a value of the predetermined threshold,
   wherein the sensing device generates a second output when the electrical characteristic exceeds the predetermined threshold and said system further comprises a second monitoring device connected to the second output of the sensing device, and
   wherein the first output of the sensing device is a relay output and the second output is a solid state output.

2. The system of claim 1, wherein the sensing device monitors the electrical characteristic of the railroad device in an electrically isolated manner.

3. The system of claim 1, wherein an electrical lead of the motor is passed through a core of the current sensing switch.

4. The system of claim 1, wherein said second monitoring device comprises one of an event recorder or alarm system.

5. The system of claim 1, wherein the first output of the sensing device is a relay output, the first monitoring device is located within a gate control mechanism for the crossing gate, the second output is a solid state output, and the second monitoring device is remotely located from the crossing gate.

6. The system of claim 1, wherein the first output of the sensing device is a relay output, the first monitoring device is located within a wayside shelter associated with the crossing gate, the second output is a solid state output, and the second monitoring device is remotely located from the crossing gate.

7. A method of monitoring a railroad device, said method comprising:
   monitoring an electrical characteristic of the rail device;
   generating a first output when the electrical characteristic exceeds a predetermined threshold; and
   providing at least one of an audible or a visual indication when the electrical characteristic exceeds the predetermined threshold,
   wherein the railroad device is a motor for a crossing gate, the electrical characteristic is a current draw of the motor and the electrical characteristic exceeding the predetermined threshold is indicative of excessive loading of the crossing gate.

8. The method of claim 7, wherein the monitor step comprises monitoring the electrical characteristic of the railroad device in an electrically isolated manner.

9. The method of claim 7, wherein the electrical characteristic is a current draw of the railroad device and the monitoring step comprises sensing the current draw in an electrically isolated manner.

10. The method of claim 7, wherein the railroad device is a motor for a crossing gate and the electrical characteristic is a current draw of the motor, said method further comprising setting a value of the predetermined threshold.

11. The method of claim 10, further comprising:
    generating a second output when the electrical characteristic exceeds the predetermined threshold; and
    monitoring the second output at a location remote from the crossing gate.

12. The method of claim 7, wherein the railroad device is a motor for a crossing gate, the electrical characteristic is a current draw of the motor and the electrical characteristic exceeding the predetermined threshold is indicative of a misalignment of mechanical components at the crossing gate.

* * * * *